US007167882B2

(12) United States Patent
Xie et al.

(10) Patent No.: US 7,167,882 B2
(45) Date of Patent: Jan. 23, 2007

(54) TRUE RANDOM NUMBER GENERATION

(75) Inventors: WenXiang Xie, Singapore (SG); Xiong Liu, Singapore (SG); WeiLoon Ng, Singapore (SG); ChoonKiat Lim, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 716 days.

(21) Appl. No.: 10/659,565

(22) Filed: Sep. 10, 2003

(65) Prior Publication Data

US 2005/0055390 A1   Mar. 10, 2005

(51) Int. Cl.
*G06F 1/02* (2006.01)
(52) U.S. Cl. .......................... 708/25; 708/250
(58) Field of Classification Search ......... 708/250–256
See application file for complete search history.

(56) References Cited

U.S. PATENT DOCUMENTS

| 3,423,683 | A | | 1/1969 | Lelsey |
| 3,445,591 | A | | 5/1969 | Koehler |
| 3,706,941 | A | | 12/1972 | Cohn |
| 4,513,386 | A | * | 4/1985 | Glazer ........................ 708/255 |
| 5,239,494 | A | | 8/1993 | Golbeck |
| 6,571,263 | B1 | | 5/2003 | Nagai |
| 2004/0205095 | A1 | * | 10/2004 | Gressel et al. .............. 708/253 |
| 2005/0102335 | A1 | * | 5/2005 | Castejon-Amenedo et al. .. 708/250 |

FOREIGN PATENT DOCUMENTS

| EP | 0981081 A2 | 2/2000 |
| WO | WO 03/040854 A2 | 5/2003 |
| WO | WO 03/079181 A2 | 9/2003 |

OTHER PUBLICATIONS

Davis, D. et al., Cryptographic Randomness from Air Turbulence in Disk Drives, Proceedings of the 14th Annual International Cryptology Conference on Advances in Cryptology, CRYPTO 94, Aug. 21-25, 1994, Santa Barbara, CA, US, Desmedt Y.G., Ed., Lecture Notes in Computer Science 1994, vol. 839, pp. 114-120.
Eastlake, D. et al., Randomness Recommendations for Security, RFC 1750, Dec. 1994, pp. 1-30 (http://rfc.dotscr.org/rfc/rfc1750.html).
Jackobsson, M. et al., A Practical Secure Physical Random Bit Generator, Proceedings of the 5th ACM Conference on Computer and Communications Security, 1998, pp. 103-111, San Francisco, CA.

* cited by examiner

*Primary Examiner*—Tan V. Mai
(74) *Attorney, Agent, or Firm*—Randall K. McCarthy

(57) ABSTRACT

True random numbers are generated from position error signals or like signals. The generator is not dependent on a potentially biased reference or threshold, and is capable of quickly generating true random numbers on demand. The present invention can be implemented as an integral functionality of a data storage device to control access to data stored in the data storage device. It can also be implemented in data storage devices for controlling access to host systems or host devices associated with the data storage devices.

18 Claims, 4 Drawing Sheets

TRUE RANDOM NUMBER GENERATION

FIELD OF THE INVENTION

The present invention relates generally to true random number generation. More particularly, the present invention relates to systems and methods for generating true random numbers suitable for use in electronic security systems.

BACKGROUND OF THE INVENTION

With improvements in the functional and storage capabilities of consumer electronic applications comes the growing need for robust security systems. For example, because mobile phones and pocket computers have developed into multi-functional devices that provide the user with telecommunication and internet access, memory and computational features, audio-visual functions, etc., an increasing amount of information, particularly confidential or personal information, is being stored on these devices. Without a good security system, all this information can be easily retrieved by others, and consequently misused to the owner's loss. One way of enhancing the integrity of a security system is to use true random numbers.

Providing true random numbers to a small, portable device is a significant technical challenge. There are systems that have settled for the use of pseudo-random numbers since pseudo-random numbers are easier to create. Unfortunately, pseudo-random numbers, being to a certain extent predictable, are generally deemed incapable of providing the desired level of protection against today's sophisticated hackers.

Others have tried to extract true random numbers from some physical phenomena. In general, these methods involve comparing a property of some natural phenomena against a predetermined threshold or reference, and generating a "1" digit or a "0" digit depending on whether the property is greater or less than the reference. The reference must be correctly determined and constantly maintained lest there is a bias towards generating one digit over the other, and resulting in a failure to generate true random numbers.

There is, therefore, a need for an improved true random number generator. The present invention addresses this and other needs, and offers advantages over other proposed solutions.

SUMMARY OF THE INVENTION

Embodiments of the present invention involve systems and methods that generate true random numbers. Phenomena with detectable randomly varying properties, such as position error signals, are identified as suitable sources from which true random numbers are derivable. Depending on whether the property of a selected event is represented by an odd or even value, the value is converted into one of the two possible binary digits. The process can be repeated to obtain more digits, which can then be concatenated to form a number of the desirable number of bytes. Variations may be made in the manner of selecting the events and in the permutations in which the digits are concatenated.

The present invention can be implemented as a function of a data storage device to control access to data stored in the data storage device. It can also be implemented in data storage devices for controlling access to host systems or host devices associated with the data storage devices.

These and various other features as well as advantages which characterize the present invention will be apparent upon reading of the following detailed description and review of the associated drawings.

DETAILED DESCRIPTION

Figure 1:
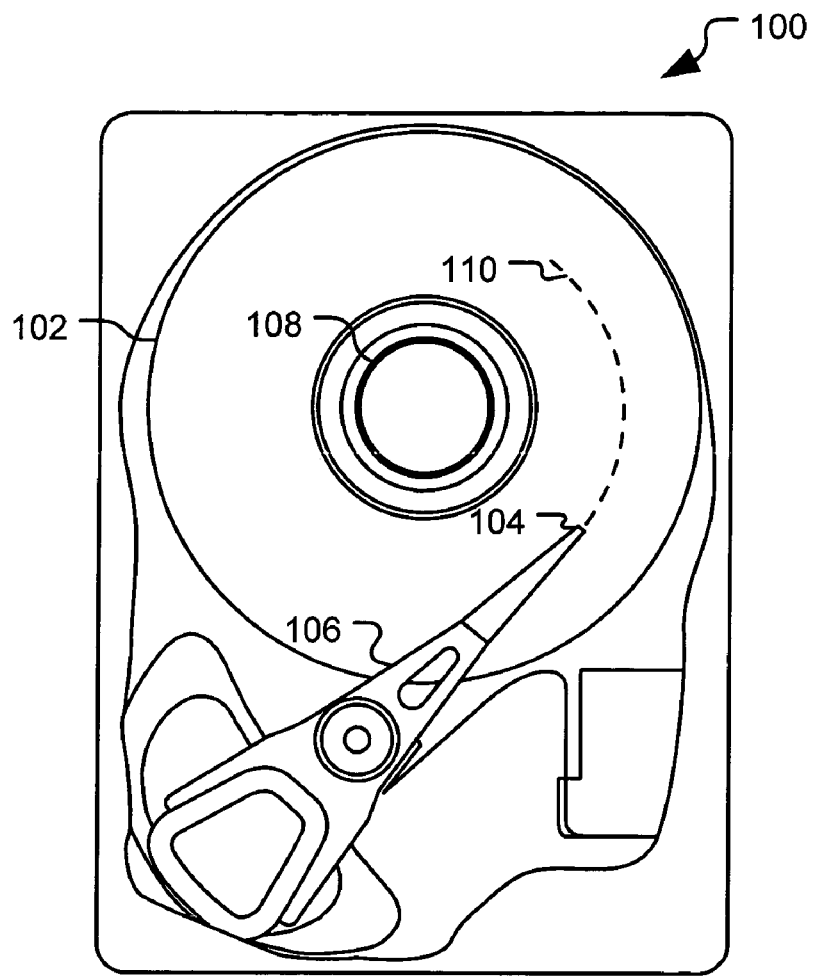
FIG. 1 shows a data storage device in which an embodiment of the present invention is implemented.
Figure 5:
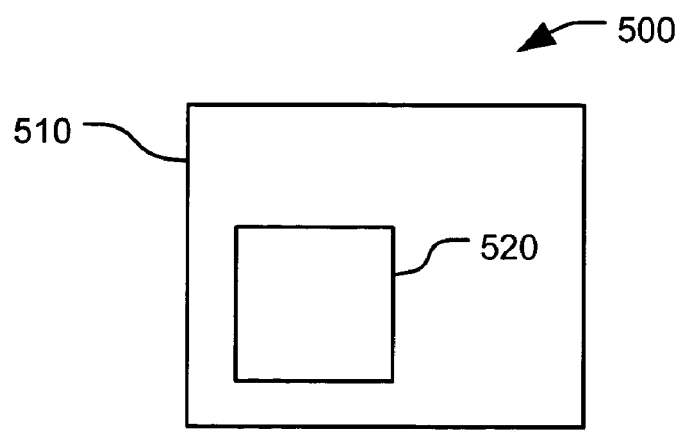
FIG. 5 is a block diagram of a system embodying the present invention.

A data storage device, of which the disc drive 100 shown in FIG. 1 is but one example, includes recording devices and recording media that are designed to be in relative motion to each other. To ensure that the recording devices and the recording media are in the desired positions, relative to each other, the data storage device generally relies on a servo system (usually encompassing servo electronics) to detect and compensate for misalignments. It is observed that such misalignments can produce parameters of near ideal spectral distribution, and can thus be a source from which true random numbers are generated. The recording media in this example is a disc 102 and the recording devices are heads 104 that are supported by an actuator assembly 106. When the disc drive 100 is powered up, a motor 108 rotates the disc 102. The heads 104 can be held near to the disc 102 so that they trace a path 110 on the disc, and in some cases, the heads 104 are intended to follow a particular track 110 on the disc 102. In some other situations, the disc drive 100 may be carrying out some read or write operations. In all these situations where the heads 104 will be able to read from servo sectors, position error signal (PES) will be available to the disc drive and true random numbers can be generated from the PES according to embodiments of the present invention.

Figure 2:
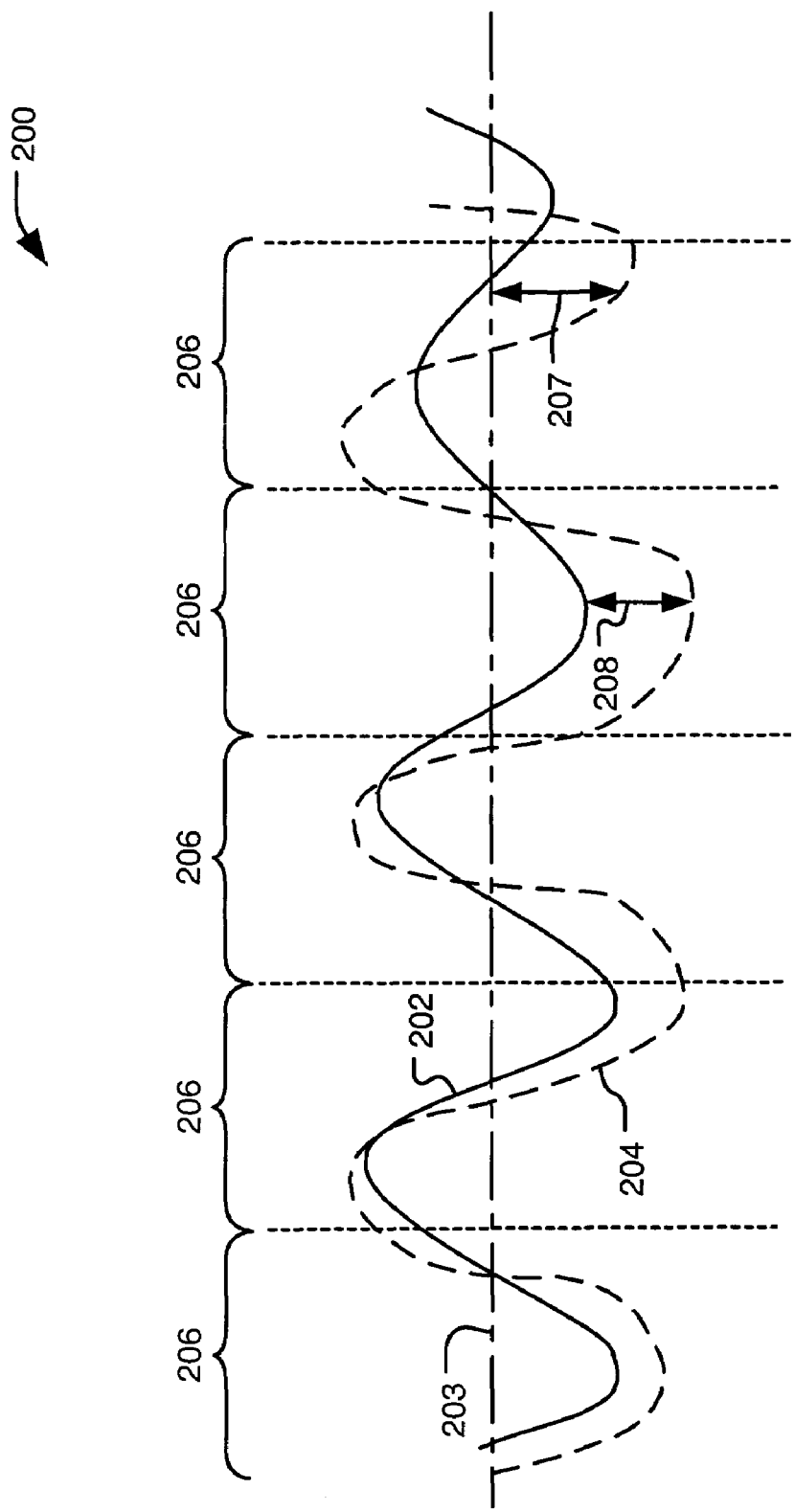
FIG. 2 is a diagram to illustrate positional errors.

FIG. 2 is a diagram showing a portion of a track 200. As the disc spins, the heads trace a path 202 that, owing to various factors, do not coincide with the ideal track (represented by a centerline 203). To address this, servo sectors 206 have positional information embedded at suitable locations to help identify misalignment of the heads. In reality, the servo sectors themselves may define a "written-in" track (represented here by centerline 204) that deviates from the ideal track 203. Such deviations are commonly referred to as "written-in" errors 207. When the disc is spinning, the heads will read from one servo sector after another, thereby resulting in intermittent feedback to the servo electronics. This feedback, generally referred to as PES, provides an indication of the position of the heads relative to the "written-in" track 204. It can be seen that the PES is related to the deviation 208 of the actual heads position 202 from the "written-in" track 204 which is defined by the servo sectors. It can be said that the PES is taken with respect to a varying reference. With this feedback, the servo electronics can cause the actuator assembly to make the required movements to compensate for any misalignment of the heads. However, despite constant effort to minimize PES and bring the heads into alignment with the "written-in" track, the PES data obtained continues to vary from servo sector to servo sector. Indeed, PES from non-neighboring servo sectors exhibit little correlation. Further, the PES from a servo sector during one revolution of the disc cannot be predicted from the PES taken from the same servo sector during an earlier revolution. The random nature of the PES is probably due to a combination of windage effects, disc flutter, micro-jog compensation errors, resonance of actuator assembly, settling errors, "written-in" errors, etc. It is proposed that PES or like parameters are suitable sources from which true random numbers can be derived.

Figure 3:
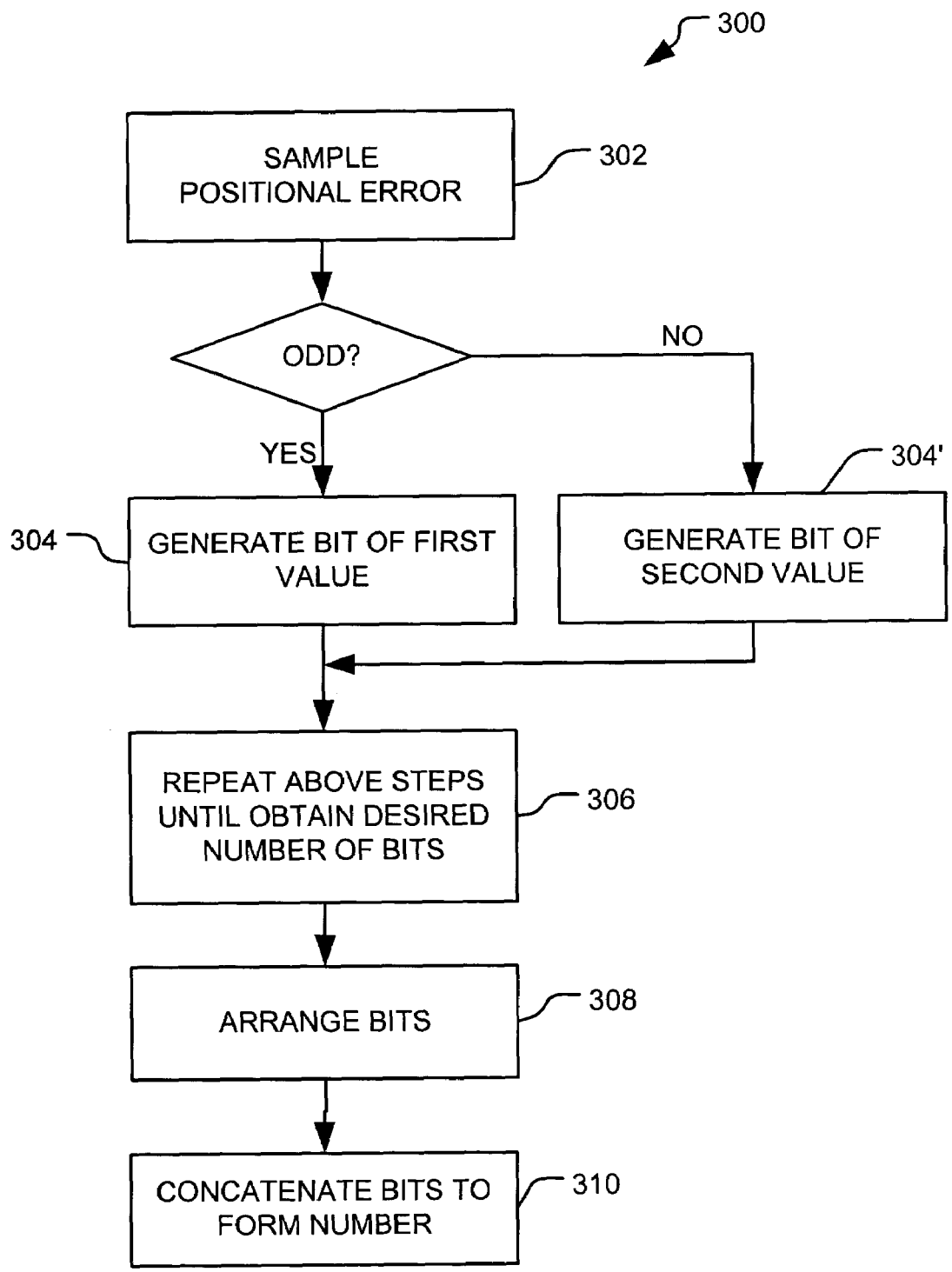
FIG. 3 is a flowchart detailing a method of generating true random numbers, according to an embodiment of the present invention.

According to the present invention, if PES data ($y_1, y_2, y_3, \ldots, y_i, \ldots, y_N$) is taken from N servo sectors, N binary digits can be obtained ($x_1, x_2, x_3, \ldots, x_i, \ldots, x_N$). As shown in the flowchart of FIG. 3, PES data $y_i$ is taken (step 302) and converted into one or the other of the two binary numbers "1" or "0", depending on whether the selected PES data $y_i$ is odd or even (step 304, 304'). This ensures the randomness of the numbers that are generated since the probabilities of the PES data being odd and being even are equal. One way of expressing the relationship between the PES data $y_i$ and the bit generated $x_i$, is shown in equation (1) below.

$$x_i = y_i \text{ modulus } 2 \tag{1}$$

By repeating the process, more binary digits can be generated (step 306). The bits are then concatenated (step 310) to form a number that is represented by a desired number of bytes. Optionally, the order of the bits in the generated number may differ from the order in which the bits have been derived (step 308).

Preferably, the number is formed from digits derived from non-successive samples of PES. This is to eliminate any possible correlation between PES at neighboring servo sectors. For example, PES sampled at intervals of n servo sectors (where n>0) can be used to form an 8-bit number. It can be represented as:

$$x_1 x_{(1+n)} x_{(1+2n)} x_{(1+3n)} x_{(1+4n)} x_{(1+5n)} x_{(1+6n)} x_{(1+7n)}$$

Continuing in this fashion, another 8-bit number can be obtained:

$$x_{(1+8n)} x_{(1+9n)} x_{(1+10n)} x_{(1+11n)} x_{(1+12n)} x_{(1+13n)} x_{(1+14n)} x_{(1+15n)}$$

There is no limit to the number of true random numbers that can be generated since there is no significant correlation between PES data taken from different revolutions. Therefore, if the number of servo sectors read in one revolution of the disc is insufficient, the process can continue into following revolutions.

Figure 4:
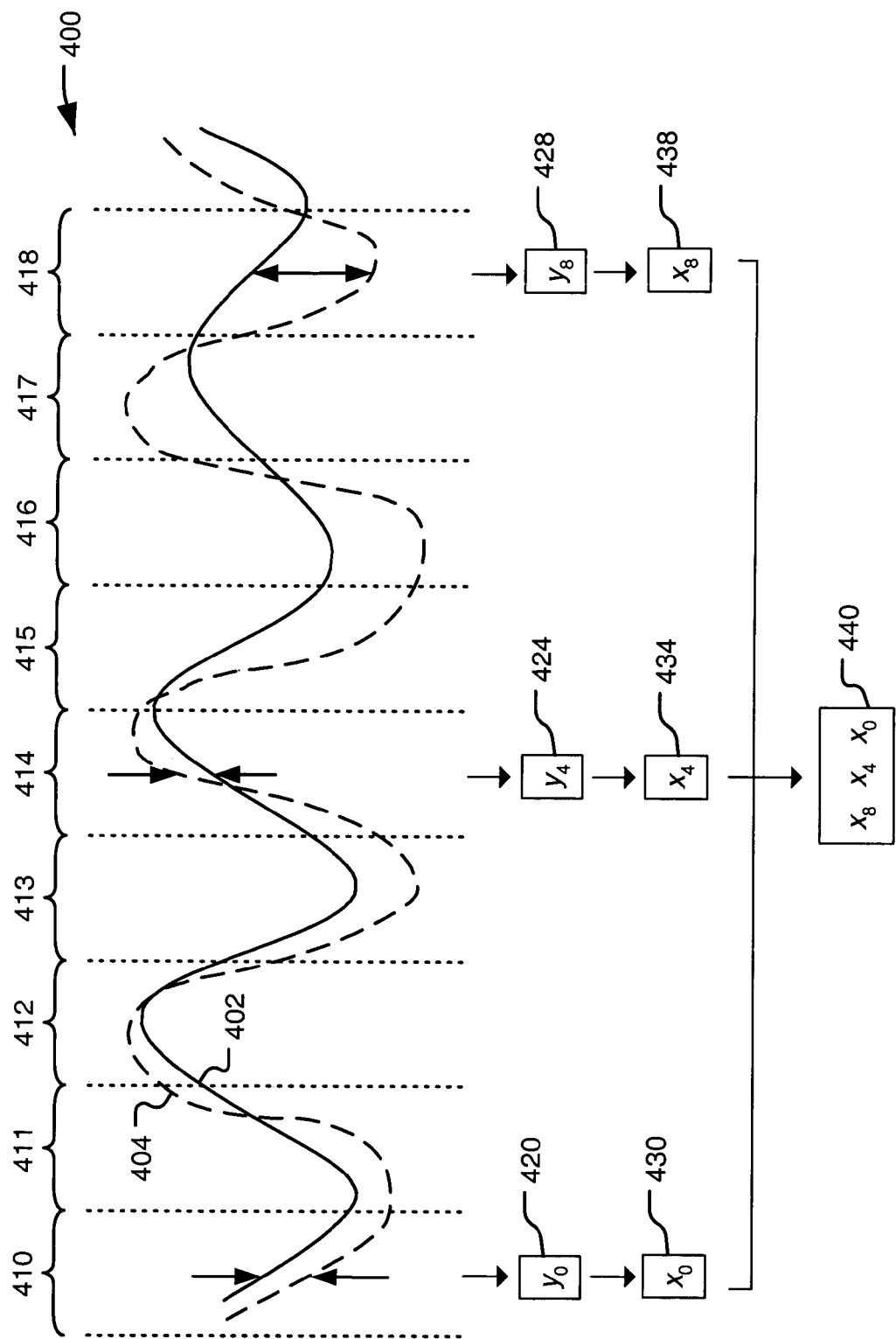
FIG. 4 illustrates one way of implementing the method of FIG. 3.

Suppose a new number having three bits is to be generated. One way of doing so, according to one embodiment of the present invention, is illustrated with the aid of FIG. 4. Shown is portion of a track 400 extending over several servo sectors designated 410 to 418 respectively. As the disc and the heads are in relative motion to each other, the heads can be perceived as moving along the track 400. The track that is pre-defined by the servo sectors is represented by centerline 404, and the actual path taken by the heads in this particular revolution of the disc is represented by centerline 402. Only the PES from three servo sectors is required, and various ways of selecting the three PES data may be used. In this case, the PES is taken from every fourth servo sector, that is, n=4. Thus, PES data $y_0, y_4, y_8$ (designated 420, 424, 428) from the servo sectors 410, 414 and 418 are utilized. If the PES data $y_0$ is odd, $y_0$ is represented by a bit $x_0$ having a value of "1". If the PES data $y_0$ is even, $y_0$ is represented by a bit $x_0$ having a value of "0". (Alternatively, a bit having the value "1" can be generated if the PES data $y_0$ is even, and "0" generated if the PES data $y_0$ is odd.) After repeating the same for PES data $y_4$ and $y_8$, there are now three bits $x_0, x_4, x_8$ (designated 430, 434, 438) for use in forming a new 3-bit number. These bits are then concatenated to form the new number (designated 440), for example, $x_8 x_4 x_0$. It will be understood that the bits can alternatively be concatenated in a different order if so desired, to form numbers other than $x_8 x_4 x_0$, such as, $x_4 x_8 x_0$, etc.

The quality of the proposed methods of generating true random numbers was demonstrated experimentally. Using a disc drive that has 264 servo sectors on a disc that is configured to spin at 5,800 revolutions per minute, PES data is collected for a number of revolutions and converted to 8-bit true random numbers according to a method of the present invention. A histogram of the 105,600 random numbers obtained shows a fairly even distribution, providing an indication that all numbers from 0 to 255 (being all numbers that can be represented in 8 bits) are generated in roughly equal number of times. To verify, the generated numbers are subjected to further analysis, namely, Fast Fourier Transform (FFT) analysis and autorelation testing. It was observed that the results of the FFT are statistically uniform. This indicates that there is practically no dependence between the generated numbers. A power spectral density plot of the generated numbers is found to be substantially a flat line. This autorelation sequence is also comparable to that obtainable for white noise, and further supports the assertion that the present invention provides for the generation of true random numbers. Clearly, the present invention provides for the generation of true random numbers, and not merely pseudo-random numbers.

In the foregoing examples, the positional errors from which the true random numbers are derived were measured with respect to a "written-in" track or a pre-defined reference. Further, the positional errors were measured from a reference that may vary from sample to sample. It will be understood that these examples are given solely for the purpose of illustration, and that other measurable or detectable phenomena can be used in place of such positional errors. One can therefore use a method of analysis similar to that described in the previous paragraph to assess if a phenomena is suitable for use in generating true random numbers in accordance with the present invention.

Many applications and systems can benefit from a true random number generator of the present invention. Contemplated are data storage devices, such as disc drives 100, that are themselves configured to generate true random numbers, and thus either enable enhanced protection of the data stored in the data storage devices, or provide associated or host systems with enhanced security features. Examples include systems 500 in which, on demand by an associated host 510 (which may be a computer, a consumer electronic device, etc.), a data storage device 520 generates a true random number and supplies the true random number to the host as an identification number. Subsequent attempts by a user to access data stored on the data storage device 520 will be successful only if the host 510 returns the same identification number to the data storage device 520. Otherwise, the data storage device 520 remains in a locked mode in which no data retrieval or recording can be carried out. This prevents unauthorized data retrieval from a data storage device that has been removed from its designated host. Other examples may include a data storage device 520 that is capable of generating true random numbers for use by its host 510. Therefore, host 510 itself does not need to be configured with the ability to generate true random numbers. Additional examples where a true random number generator of the present invention can be implemented includes security systems that utilize random numbers.

Various other advantages and benefits can be achieved by implementing the present invention. For example, a true random number generator of the present invention can generate true random numbers very quickly. It has been verified that as many as 844,800 bytes of PES data can be collected and converted to 105,600 bytes of true random numbers within 33.1 seconds. If a faster disc drive or processor is used, or if the disc has more servo sectors, the speed at which the true random numbers are generated can conceivably be further increased.

The present invention is further advantageous over other methods because of its ability to reliably produce true random numbers without the need for tuning or adjustment of system parameters. This can be particularly important in applications where true random numbers must be generated immediately upon power-up. Other situations where this capability can be especially useful include applications where there is little or no time to wait for the system to settle down, or to conduct self-tuning.

In addition, because this method does not require the involvement of any specific seek, read or write operation, a disc drive can produce true random numbers any time the disc is spinning and the heads are interfacing with servo sectors. This flexibility broadens the scope of applications of the proposed true random number generator and shortens the time required for generating the required true random numbers. Because the present invention can make use of the readily available PES data as a source for true random number generation, and PES is typically available in a digitized form, one further advantage of using PES data as a source is that the parity of PES samples can be easily ascertained without the need for an additional analog-to-digital converter. Suitably randomly varying analog signals can nevertheless be used in embodiments of the present invention by converting the analog data into a form from which parity can be determined.

Most advantageously, various embodiments of the present invention can be implemented without making hardware changes to a conventional disc drive. It is also envisioned that embodiments of the present invention can be incorporated in a wide range of data storage devices that include servo systems involving PES or similar signals.

Alternatively described, contemplated embodiments of the present invention includes a method (such as 300) of generating a number involving generating a bit of a first value if a phenomena is represented by an odd variable, and generating a bit of a second value if the phenomena is represented by an even variable (such as 304, 304'). This method may further involve repeating the step of generating a bit to obtain more than one bit (such as 306), and concatenating the bits to form a new number (such as 308). Further, the method may include a step of arranging the bits before concatenating the bits (such as 440). Optionally, measurements of the phenomena may be taken at intervals, and each of the measurements (such as 420, 424, 428) may provide one variable for use in generating one bit (such as 430, 434, 438). If so desired, the measurements may be taken with respect to a changeable reference (such as 204, 404). The bits can also be generated from non-successive measurements (such as 420, 424, 428). In some embodiments, the measurements are positional errors (such as 208). In alternative embodiments, the variable may include a position error signal (such as 208).

Also contemplated is a system (such as 100, 400, 500) for generating a number, having a detector (such as 104) that is configured to translate a detected phenomena into one or more quantitative measurements (such as 208), and a generator (such as 100, 300, 520) that is configured to generate a bit of a first value if a selected quantitative measurement is odd and to generate a bit of a second value if the selected quantitative measurement is even (such as 304,304'). The generator may be further configured to form a new number by concatenating the bits generated (such as 310, 440). The generator can optionally be configured to arrange bits for concatenation (such as 308).

In some embodiments, the system (such as 500) includes a host (such as 510) for receiving the new number from the generator (such as 520). The new number can thus be used for controlling access to the host (such as 510). Alternatively, the generator (such as 520) can be part of a data storage device that is associated with the host (such as 510), and the new number can be used for controlling access to the data storage device (such as 520).

Further embodiments of the present invention includes a data storage device (such as 100) having a disc (such as 102) with at least one track and heads (such as 104) that are configured to read or write substantially along the track. The data storage device (such as 100) also includes the system (such as 400) in such a way that the detectors include the heads (such as 102). The data storage device (such as 100) is configured so that the phenomena may be related to the position of the heads relative to the track (such as 208). For example, the quantitative measurements may include position error signals (such as 208). Optionally, the quantitative measurements are taken with reference to at least one previously defined track (such as 204).

It is to be understood that even though numerous characteristics and advantages of various embodiments of the present invention have been set forth in the foregoing description, this disclosure is illustrative only, and changes may be made within the principles of the present invention without departing from the scope of the present invention.

What is claimed is:

1. A method, comprising:
    sampling a signal at intervals to acquire data samples having a data sample sequence order;
    obtaining a generated bit for at least one of the data samples by:
        generating a bit with a first value when the at least one data sample is represented as odd, and
        generating a bit with a second value when the at least one data sample is represented as even; and
    concatenating the generated bit with at least one additional generated bit in an order that is independent from the data sample sequence order.

2. The method of claim 1, wherein the data samples comprise a first data sample and a second data sample, wherein a first generated bit corresponds to the first data sample and a second generated bit corresponds to the second data sample; and wherein the first generated bit and the second generated bit are concatenated in an order different from the order that the first data sample and the second data sample were sampled.

3. The method of claim 1, wherein the data sample sequence order comprises a sequence of data samples having an order $(X_1, X_2, X_3, \ldots, X_n)$; and wherein there is a sequence of generated bits $(Y_1, Y_2, Y_3, \ldots, Y_n)$ with each generated bit corresponding to a respective data sample in the sequence of data samples.

4. The method of claim 3, wherein the generated bits are concatenated in an order that is different from the order of their respective data samples.

5. The method of claim 4, in which the data samples are positional errors.

6. The method of claim 1, in which the signal is generated from a changeable reference.

7. The method of claim 1, in which multiple bits are generated from non-successive intervals.

8. The method of claim 1, in which the signal comprises a position error signal.

9. A system comprising:
a detector configured to sample a signal to acquire data samples having a data sample sequence order; and
a generator configured to generate a bit with a first value when a selected data sample is odd and to generate a bit with a second value when the selected data sample is even and further configured to generate a number by concatenating the generated bit with at least one additional generated bit in an order that is independent from the data sample sequence order.

10. The system of claim 9, wherein the data samples comprise a first data sample and a second data sample, wherein a first generated bit corresponds to the first data sample and a second generated bit corresponds to the second data sample; and wherein the first generated bit and the second generated bit are concatenated in an order different from the order that the first data sample and the second data sample were sampled.

11. The system of claim 9, wherein the data sample sequence order comprises a sequence of data samples having an order $(X_1, X_2, X_3, \ldots, X_n)$; and wherein there is a sequence of generated bits $(Y_1, Y_2, Y_3, \ldots, Y_n)$ with each generated bit corresponding to a respective data sample in the sequence of data samples and wherein the generated bits are concatenated in an order that is different from the order of their respective data samples.

12. The system of claim 9, further comprising a device for receiving the number from the generator.

13. The system of claim 12, in which the number is used for controlling access to the device.

14. The system of claim 12, in which the generator is part of a data storage device, and in which the number is used for controlling access to the data storage device.

15. The system of claim 9, comprising:
a disc having at least one track; and
a head configured to read or write substantially along the track.

16. The system of claim 15 in which the signal relates to the position of the head relative to the track.

17. The system of claim 16 in which the signal is a position error signal.

18. The system of claim 16 in which the data samples are taken with reference to at least one previously defined track.

* * * * *